(12) United States Patent
Sah

(10) Patent No.: US 9,104,595 B2
(45) Date of Patent: Aug. 11, 2015

(54) SELECTIVE REMEDIAL ACTION BASED ON CATEGORY OF DETECTED ERROR FOR A MEMORY READ

(71) Applicant: Intel Corporation, Santa Clara, CA (US)

(72) Inventor: Suneeta Sah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 152 days.

(21) Appl. No.: 13/797,681

(22) Filed: Mar. 12, 2013

(65) Prior Publication Data

US 2014/0281805 A1  Sep. 18, 2014

(51) Int. Cl.
*G11C 29/00* (2006.01)
*G06F 11/10* (2006.01)
*G11C 29/42* (2006.01)

(52) U.S. Cl.
CPC ........ *G06F 11/1048* (2013.01); *G06F 11/1004* (2013.01); *G11C 29/42* (2013.01)

(58) Field of Classification Search
CPC .. G06F 11/1048; G06F 11/1004; G11C 29/42

USPC ............. 714/6.13, 746, 763, 807, 42
See application file for complete search history.

(56) References Cited

U.S. PATENT DOCUMENTS

| | | | |
|---|---|---|---|
| 5,912,906 A * | 6/1999 | Wu et al. ................. 714/763 |
| 7,308,603 B2 * | 12/2007 | Carver et al. ............ 714/6.13 |
| 7,308,638 B2 * | 12/2007 | Nerl et al. ............... 714/763 |
| 8,015,438 B2 * | 9/2011 | Bruennert et al. ....... 714/6.13 |
| 8,645,811 B2 * | 2/2014 | Sauber et al. ............ 714/807 |

\* cited by examiner

*Primary Examiner* — Shelly A Chase
(74) *Attorney, Agent, or Firm* — Schwabe, Williamson & Wyatt, P.C.

(57) ABSTRACT

Embodiments of apparatus, methods, systems, computer-readable storage media and devices are described herein for determining an error category for a detected error in data read from a volatile memory; and selectively performing or causing an additional remedial action based at least in part on the error category determined. In various embodiments, the determining and the performing or causing may be undertaken in response to the correcting. The memory may be volatile or non-volatile memory. Other embodiments may be described and/or claimed.

20 Claims, 3 Drawing Sheets

SELECTIVE REMEDIAL ACTION BASED ON CATEGORY OF DETECTED ERROR FOR A MEMORY READ

FIELD

Embodiments of the present invention relate generally to the technical field of data processing, and more particularly, to selective remedial action based on a determined category of a detected error for a memory read.

BACKGROUND

The background description provided herein is for the purpose of generally presenting the context of the disclosure. Work of the presently named inventor to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

As portable computing devices such as smart phones and tablet computers become more ubiquitous, volatile memory (e.g., dynamic random access memory, or "DRAM") may be designed to store more and more data in smaller spaces. Memory cells may be reduced in size, and more memory cells may be packed closely together in smaller spaces. These changes may lead to an increase in memory errors.

As volatile memory technologies such as DRAM technologies are scaled to smaller dimensions, reliability issues arise that require mitigation by careful design. One such issue is the noise injected into neighboring cells when a row is activated and refreshed. The voltage swings and current driven when a row (called the aggressor) is activated or refreshed can inject noise into neighboring cells (victims), potentially draining a little bit of charge from the victim's storage capacitors. The more often the aggressor row is activated before its victim neighbors are activated or refreshed, and the weaker the victim cells (smaller charge, higher leakage, etc.), the higher the probability that one or more cells in the victim row will flip and thus cause data corruption.

For example, during an activate command, a row in the volatile memory may be read and then written back to the volatile memory. During this process, electrons from one cell or row of cells may "leak" into a neighboring cell or row of cells, corrupting the neighboring data. This may be referred to as a "row hammer" error (also referred to as a "pass gate issue"). As another example, smaller memory cells may lose their charge more quickly than larger memory cells, and sometimes more quickly than a memory refresh interval. The result may be a loss and/or corruption of data. Other memory errors may be caused by cosmic rays and/or alpha particle emission. Many of these errors may be considered "soft" or "transient" because they may be readily correctable and not indicative of a more persistent underlying issue, such as hardware damage, malfunction, or defect.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the terms "block," "module" and/or "logic" may refer to, be part of, or include an Application Specific Integrated Circuit ("ASIC"), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
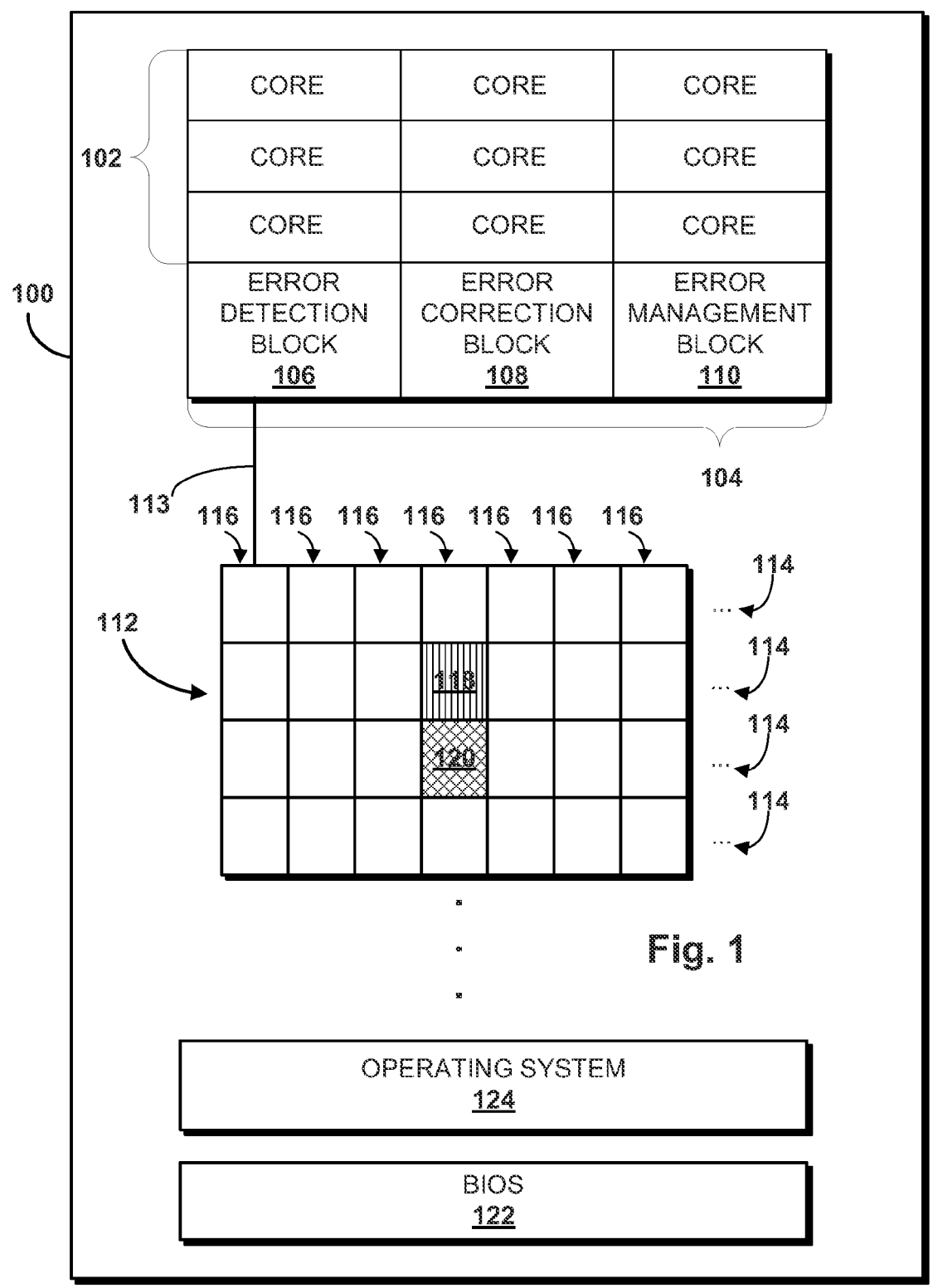
FIG. 1 schematically illustrates an example system configured with applicable portions of the present disclosure, in accordance with various embodiments.

With reference to FIG. 1, in various embodiments, a system 100 may include one or more processing units (e.g., cores) 102, and a memory controller 104, coupled with each other. In various embodiments, memory controller 104 may include an error detection block 106, an error correction block 108, and/or an error management block 110, which may or may not be coupled with each other and/or the one or more processing units 102. Error detection block 106, error correction block 108, and/or error management block 110 may be implemented with any combination of hardware and software. The configuration shown in FIG. 1 is just one non-limiting example. In other embodiments, error detection block 106, error correction block 108, and/or error management block 110 may be separate from memory controller 104 and/or each other.

In various embodiments, system 100 may also include memory 112. Memory 112 may be coupled with, and employed to store data accessible by, one or more processing units 102. For example, information may be written to and/or read from memory 112 by one or more processing units 102, e.g., by way of one or more communication lines 113. In various embodiments, one or more communication lines 113 may include one or more buses implemented with various technologies, such as those defined by the Joint Electron Devices Engineering Council ("JEDEC") double data rate type three synchronous DRAM ("DDR3 SDRAM") standard.

Memory 112 may be any memory that may lose charge over time, have charge leaked from one cell to another, and/or be affected by external influences such as cosmic rays and/or particle emission, thus incurring errors. For instance, memory 112 may be volatile memory, including but not limited to dynamic random access memory ("DRAM"). In various embodiments, system 100 may also include a basic input/output system ("BIOS") 122 and/or an operating system 124.

In various embodiments, memory 112 may include a plurality of rows 114 and a plurality of columns 116. In some embodiments, each row 114 may correspond to a page. In the example of FIG. 1, one row 114 may include a first portion 118 of memory 112 that may contain some data (indicated by the vertical lines). A neighboring row 114 may include a second portion 120 of memory 112 that may contain erroneous data. In various embodiments, the erroneous data contained in second portion 120 may have been corrupted by the presence of charge in one or more cells that forms the data stored in first portion 118, e.g., by charge leaking from one or more cells of first portion 118 to one or more cells of second portion 120. In some cases, an "ACTIVATE ROW" command employed on the row 114 with first portion 118 may result in charge leaking to neighboring rows, such as the row 114 with second portion 120. In various embodiments, the erroneous data contained in second portion 120 may have been corrupted for reasons entirely unrelated to first portion 118. For example, charge in one or more cells of second portion 120 may have lost their charge, e.g., over time and/or due to interference.

Whatever the reason for the error, in various embodiments, error detection block 106 may be configured to detect the error in data read from second portion 120. Error detection block 106 may detect errors using various error detection techniques, including but not limited to cyclic redundancy checks, hash functions, checksums, parity bits, repetition codes, and so forth.

In various embodiments, error correction block 108 may be configured to correct one or more errors detected in the data read from second portion 120. Error correction block 108 may correct errors using a variety of error correction techniques. These may include but are not limited to error correction codes (e.g., forward error correction), convolutional codes such as the Viterbi decoder, block codes such as turbo codes, Hamming codes, Reed-Salomon codes, and/or low density parity checking ("LDPC"), and so forth.

In various embodiments, error management block 110 may be configured to determine an error category for an error detected by error detection block 106. In various embodiments, error management block 110 may be configured to selectively perform or cause an additional remedial action based at least in part on the determined error category. In various embodiments, error management block 110 may undertake the determination and the performance/causation in response to a correction e.g., by error correction block 108, of a detected error in data read from memory 112.

In various embodiments, error management block 110 may be configured to categorize an error, e.g., detected by error detection block 106, as "soft" or "transient" in response to various events. An error may be considered "transient" if it is not indicative of a more persistent underlying issue, such as a hardware malfunction or defect, or of damage caused to hardware, e.g., from an outside force. Transient errors may not warrant additional remedial action beyond perhaps inclusion of an entry in a log and/or incrementing one or more error counters (e.g., for row hammer error or pass gate issue testing purposes). In contrast, more persistent errors that may be caused by underlying hardware issues (e.g., defect, malfunction, damage, etc.) may warrant additional remedial action. For example, error management block 110 may cause an interrupt such as a system management interrupt ("SMI") and/or a correct machine check interrupt ("CMCI") to be raised. A software exception handler forming part of operating system 124, BIOS 122 and/or another system component may perform an appropriate error-handling routine.

Transient errors in a memory cell or row of memory cells may have a variety of causes, such as data corruption caused by neighboring cells or rows of cells (e.g., from a row hammer error/pass gate issue), a cell losing its charge, external interference, and so forth. Transient errors may be correctible, e.g., by error correction block 108. After data corrected to remove transient errors is rewritten back to memory 112, errors would not typically be immediately redetected in the same portion of memory. (There may be, of course, a small probability that an error would reappear immediately after error correction in spite of no more persistent underlying issues; however, this is unlikely).

In various embodiments, error management block 110 may be configured to categorize an error, e.g., detected by error detection block 106, as transient in response to a determination, e.g., by error detection block 106 or error management block 110, that the detected error is absent from second portion 120 after the error correction. For example, error detection block 106 may recheck the error-corrected data after it is rewritten back to second portion 120.

However, if an error is still present after error correction, error management block 110 may categorize the error as not transient. In such case, error management block 110 may cause various remedial actions to be taken. For example, error management block 110 may raise an interrupt, such as an SMI or CMCI. Various components of system 100, such as BIOS 122, operating system 124 and/or other software, may include exception handlers configured to take appropriate remedial action in response to such interrupts. The remedial action taken by these components may be system and/or situation dependent.

Figure 2:
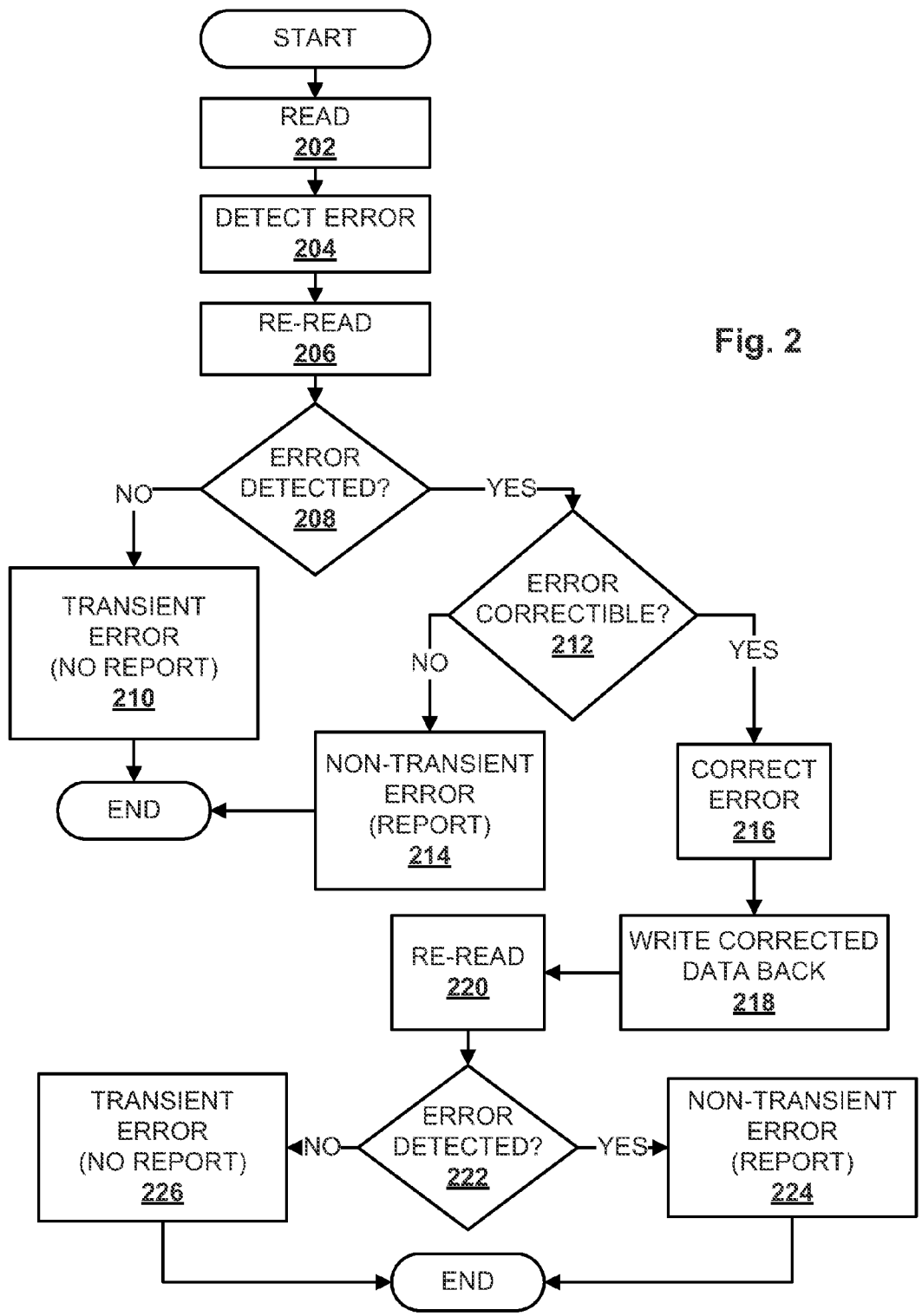
FIG. 2 depicts an example method that may be implemented on a system configured with applicable portions of the present disclosure, in accordance with various embodiments.

An example method 200 that may be implemented by, e.g., memory controller 104 equipped with error detection block 106, error correction block 108, and/or error management block 110 is depicted in FIG. 2. While shown in a particular order, that is not meant to be limiting, and various operations of FIG. 2 may be performed in a different order and/or omitted.

At block 202, a portion of memory 112, such as second portion 120 of memory 112, may be read, e.g., by memory controller 104. At operation 204, an error may be detected, e.g., by error detection block 106, in second portion 120 of memory. This may in some embodiments cause memory controller 104 to re-read second portion 120 of memory 112 at block 206.

At block 208, if the error is no longer detected, e.g., by error detection block 106, in second portion 120 of memory 112, then at block 210, the error may be categorized, e.g., by error management block 110, as transient. Minimal remedial action, if any, may be undertaken, and the error may not be reported via interrupt to an entity such as BIOS 122 and/or operating system 124, e.g., by error management block 110. In some cases, one or more error counters (not shown) associated with memory controller 104 may be incremented, e.g., by error management block 110. In some embodiments, a log may be updated to document the error, e.g., for diagnostic purposes. For example, an interrupt may be raised, e.g., by error management block 110, that triggers an exception handler routine to add an entry to a log stored in non-volatile memory. Method 200 may then end.

However, if at block 208 an error is once again detected, e.g., by error detection block 106, in second portion 120 of memory 112, method 200 may proceed to block 212. At block 212, if the detected error is determined, e.g., by error correction block 108, to be uncorrectable, then appropriate remedial action may be taken, e.g., by error management block 110, and method 200 may end. For example, in some embodiments, at block 214, a report of a non-transient error may be generated, e.g., by error management block 210, and provided to another entity, such as BIOS 122 and/or operating system 124 (e.g., by raising an interrupt that is detected by an exception handler). As noted previously, such reporting may in some cases result in a system failure, which may be appropriate given the relative persistency of the error.

Back at block 212, if the detected error is determined, e.g., by error correction block 108, to be correctible, then at block 216, the error may be corrected, e.g., by error correction block 108. At block 218, the corrected data may then be written, e.g., by error correction block 108, back to second portion 120 of memory 112. In some embodiments, a controller hook (e.g., executable code configured to intercept function calls, events or messages) may be included with memory controller 104 to detect when error correction block 108 corrects an error and/or writes the corrected data back to memory. The controller hook may then direct execution of method 200 to block 220.

At block 220, the rewritten corrected data may be once again read, e.g., by memory controller 104. At block 222, if an error is once again detected, e.g., by error detection block 106, then at block 224, the error may be categorized, e.g., by error management module 110, as non-transient, and suitable remedial action may be taken, similar to block 210, e.g., by error management block 110. However, at block 222, if an error is not detected, e.g., by error detection block 106, then at block 226, the previously-detected error may be categorized as transient, e.g., by error management block 110, and suitable remedial action, if any, may be taken (e.g., no report to BIOS 122 or operating system 124). In some cases, one or more error counters (not shown) associated with memory controller 104 may be incremented, e.g., by error management block 110.

All or selected aspects of method 200 may be invoked for a variety of reasons, in accordance with various embodiments. In some embodiments, method 200 may be implemented as part of routine memory scrubbing to correct errors. In various embodiments, "patrol scrubbing" may involve automatically reading and correcting errors in memory, e.g., at predetermined intervals (e.g., every 16K cycles) and/or when the system is idle. "On demand" scrubbing may be similar to patrol scrubbing except that it is performed on demand, rather than automatically.

Figure 3:
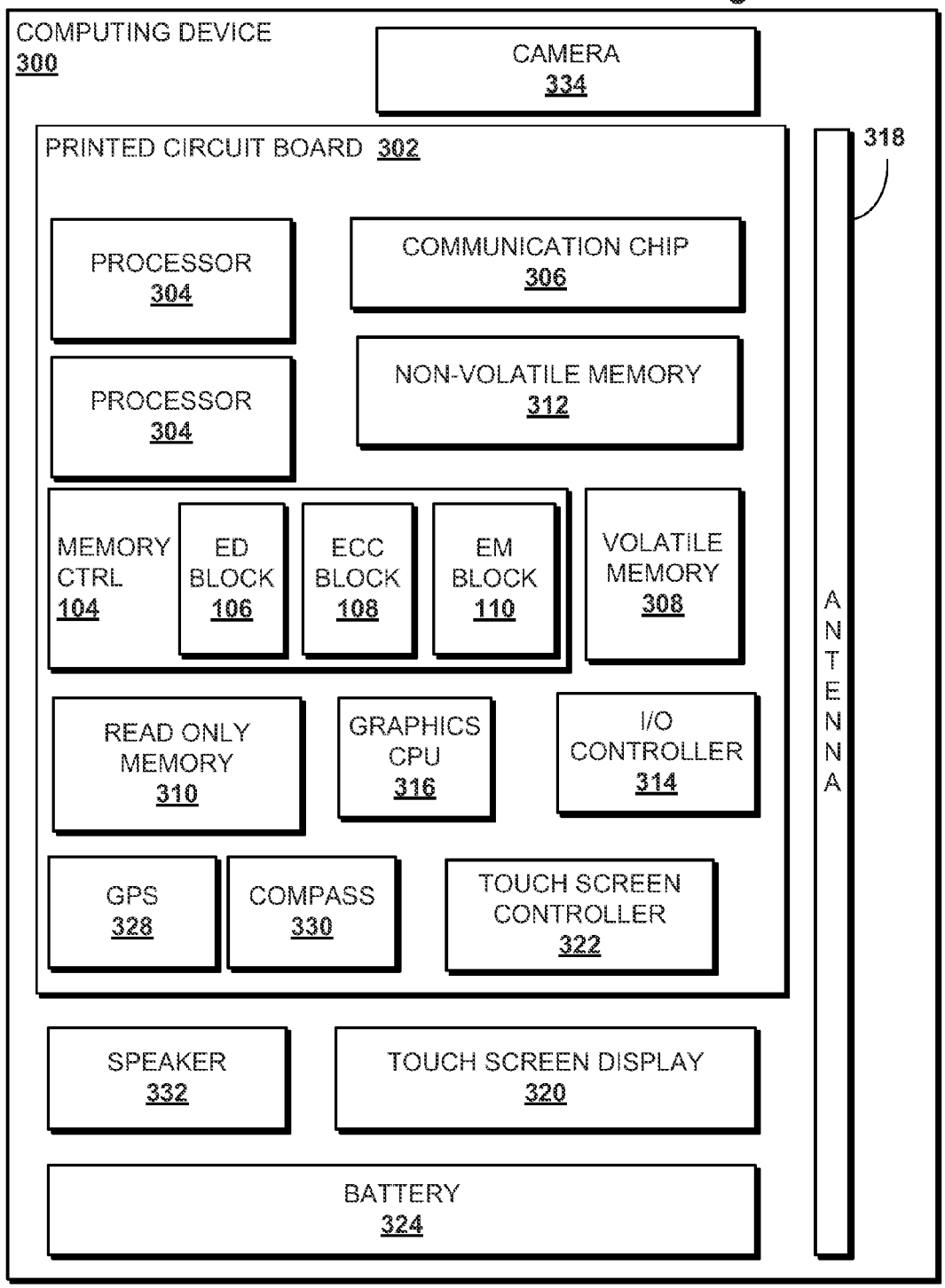
FIG. 3 schematically depicts an example computing device that may be configured with applicable portions of the present disclosure, in accordance with various embodiments.

FIG. 3 illustrates an example computing device 300 in which systems such as system 100 may be incorporated, in accordance with various embodiments. Computing device 300 may include a number of components, one or more processor(s) 304, memory controller 104, and at least one communication chip 306. In various embodiments, the one or more processor(s) 304 each may include one or more processor cores. In various embodiments, memory controller 104 may include error detection, or "ED," block 106, error correction, or "ECC," block 108, and/or error management, or "EM," block 110, configured to perform the functions earlier described. In various embodiments, the at least one communication chip 306 may be physically and electrically coupled to the one or more processor(s) 304. In further implementations, the communication chip 306 may be part of the one or more processor(s) 304. In various embodiments, computing device 300 may include printed circuit board ("PCB") 302. For these embodiments, the one or more processor(s) 304 and communication chip 306 may be disposed thereon. In alternate embodiments, the various components may be coupled without the employment of PCB 302.

Depending on its applications, computing device 300 may include other components that may or may not be physically and electrically coupled to the PCB 302. These other components include, but are not limited to, volatile memory 308, read-only memory ("ROM") 310, non-volatile memory 312, an input/output ("I/O") controller 314, a digital signal processor (not shown), a crypto processor (not shown), a graphics processor 316, one or more antenna 318, a display (not shown), a touch screen display 320, a touch screen controller 322, a battery 324, an audio codec (not shown), a video codec (not shown), a global positioning system ("GPS") device 328, a compass 330, an accelerometer (not shown), a gyroscope (not shown), a speaker 332, a camera 334, and a mass storage device (such as hard disk drive, a solid state drive, compact disk ("CD"), digital versatile disk ("DVD"))(not shown), and so forth.

In various embodiments, volatile memory 308 may come in various forms, including but not limited to DRAM, static RAM ("SRAM"), Thyristor RAM ("T-RAM"), Zero capacitor RAM ("Z-RAM"), twin transistor RAM ("TTRAM"), and so forth. In various embodiments, non-volatile memory 312 may come in various forms, including but not limited to NAND (flash) memory, ferroelectric random-access memory ("FeTRAM"), nanowire-based non-volatile memory, three-dimensional ("3D") cross point memory such as phase change memory ("PCM") or PCM with switch ("PCMS"), memory that incorporates memristor technology, magnetoresistive random-access memory ("MRAM"), spin transfer torque MRAM ("STT-MRAM"), and so forth. In various embodiments, the processor 304 may be integrated on the same die with other components, such as memory controller 104, control block 106 and/or error correction block 108, to form a System on Chip ("SoC").

In various embodiments, memory controller 104 may be operated by and/or coupled with volatile memory 308 and/or the one or more processor(s) 304. In some embodiments, the one or more processor(s) 304 and/or volatile memory 308 may include associated firmware (not shown) storing programming instructions configured to enable computing device 300, in response to execution of the programming instructions by one or more processor(s) 304, to implement memory controller 104, error detection block 106, error correction block 108, and/or error management block 110, any of which may be configured to practice all or selected aspects of method 200. In various embodiments, memory controller 104, error detection block 106, error correction block 108, and/or error management block 110 may additionally or alternatively be implemented using hardware separate from the one or more processor(s) 304.

The communication chips 306 may enable wired and/or wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to IEEE 702.20, General Packet Radio Service ("GPRS"), Evolution Data Optimized ("Ev-DO"), Evolved High Speed Packet Access ("HSPA+"), Evolved High Speed Downlink Packet Access ("HSDPA+"), Evolved High Speed Uplink Packet Access ("HSUPA+"), Global System for Mobile Communications ("GSM"), Enhanced Data rates for GSM Evolution ("EDGE"), Code Division Multiple Access ("CDMA"), Time Division Multiple Access ("TDMA"), Digital Enhanced Cordless Telecommunications ("DECT"), Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

In various implementations, the computing device 300 may be a laptop, a netbook, a notebook, an ultrabook, a smart phone, a computing tablet, a personal digital assistant ("PDA"), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 300 may be any other electronic device that processes data.

EXAMPLES

Example 1 is directed to an apparatus comprising: a memory controller configured to determine an error category for a detected error, and selectively perform or cause an additional remedial action based at least in part on the error category determined, wherein the determination and the performance or causation are undertaken in response to a correction of the detected error in the data read from the memory.

Example 2 includes the apparatus of Example 1, wherein the memory controller is further configured to categorize the detected error as transient in response to a determination that the detected error is absent from the memory after the correction.

Example 3 includes the apparatus of Example 2, wherein the memory controller is further configured to categorize the detected error as transient in response to a determination that the detected error is absent from the memory after a write of the error-correct data back to the memory.

Example 4 includes the apparatus of any one of Examples 1-3, wherein the apparatus further comprises a BIOS coupled to the memory controller, and the memory controller is further configured to report the detected error to the BIOS in response to detection of an error in the memory by the memory controller after the correction.

Example 5 includes the apparatus of any one of Examples 1-3, wherein the apparatus further comprises an operating system coupled to the memory controller, and the memory controller is further configured to report the detected error to the operating system in response to detection of an error in the memory by the memory controller after the correction.

Example 6 includes the apparatus of any one of Examples 1-3, wherein the memory controller is further configured to assert a SMI in response to detection of an error in the memory by the memory controller after the correction.

Example 7 includes the apparatus of any one of Examples 1-3, wherein the memory comprises volatile memory.

Example 8 includes the apparatus of Example 7, wherein the memory comprises DRAM.

Example 9 includes the apparatus of Example 8, wherein the memory comprises a DRAM cache line.

Example 10 is directed to at least one storage medium comprising instructions stored therein, wherein the instructions, in response to execution by a controller, cause the controller to:

detect an error in data read from a memory; correct the detected error in the data read from the memory; determine an error category for the detected error; and selectively perform or cause an additional remedial action based at least in part on the error category determined; wherein the determination and the performance or causation are undertaken in response to the correction.

Example 11 includes the at least one storage medium of Example 12, wherein the instructions, in response to execution by the controller, cause the controller to categorize the detected error as transient in response to a determination that the detected error is absent from the memory after the correction.

Example 12 includes the at least one storage medium of Example 11, wherein the instructions, in response to execution by the controller, cause the controller to categorize the detected error as transient in response to a determination that the detected error is absent from the memory after a write of the error-correct data back to the memory.

Example 13 includes the at least one storage medium of any one of Examples 10-12, wherein the instructions, in response to execution by the controller, cause the controller to report the detected error to a BIOS in response to detection of an error in the memory after the correction.

Example 14 includes the at least one storage medium of any one of Examples 10-12, wherein the instructions, in response to execution by the controller, cause the controller to report the detected error to an operating system in response to detection of an error in the memory after the correction.

Example 15 includes the at least one storage medium of any one of Examples 10-12, wherein the instructions, in response to execution by the controller, cause the controller to assert a SMI in response to detection of an error in the memory after the correction.

Example 16 includes the at least one storage medium of any one of Examples 10-12, wherein the memory comprises volatile memory.

Example 17 includes the at least one storage medium of Example 16, wherein the memory comprises DRAM.

Example 18 includes the at least one storage medium of Example 17, wherein the memory comprises a DRAM cache line.

Example 19 is directed to a computer-implemented method, comprising: detecting, by a computing device, an error in data read from a memory; correcting, by the computing device, the detected error in the data read from the memory; determining, by the computing device, an error category for the detected error; and selectively performing or causing, by the computing device, an additional remedial action based at least in part on the error category determined; wherein the determining and the performing or causing are undertaken in response to the correcting.

Example 20 includes the computer-implemented method of Example 19, further comprising categorizing, by the computing device, the detected error as transient in response to a determination that the detected error is absent from the memory after the correction.

Example 21 includes the computer-implemented method of Example 20, further comprising categorizing, by the computing device, the detected error as transient in response to a determination that the detected error is absent from the memory after a write of the error-correct data back to the memory.

Example 22 includes the computer-implemented method of any one of Examples 19-21, further comprising reporting, by the computing device, the detected error to a BIOS in response to detecting an error in the memory after the correction.

Example 23 includes the computer-implemented method of any one of Examples 19-21, further comprising reporting, by the computing device, the detected error to an operating system in response to detecting an error in the memory after the correction.

Example 24 includes the computer-implemented method of any one of Examples 19-21, further comprising asserting, by the computing device, a SMI in response to detecting an error in the memory after the correction.

Example 25 is directed to an apparatus comprising: means for detecting an error in data read from a memory; means for correcting the detected error in the data read from the memory; means for determining an error category for the detected error; and means for selectively performing or causing an additional remedial action based at least in part on the error category determined; wherein the means for determining and the means for performing or causing are operated in response to operation of the means for correcting.

Example 26 includes the apparatus of Example 25, further comprising means for categorizing the detected error as transient in response to a determination that the detected error is absent from the memory after the correction.

Example 27 includes the apparatus of Example 26, further comprising means for categorizing the detected error as transient in response to a determination that the detected error is absent from the memory after a write of the error-correct data back to the memory.

Example 28 includes the apparatus of any one of Examples 25-27, further comprising means for reporting the detected error to a BIOS in response to detection of an error in the memory after the correction.

Example 29 includes the apparatus of any one of Examples 25-27, further comprising means for reporting the detected error to an operating system in response to detection of an error in the memory after the correction.

Example 30 includes the apparatus of any one of Examples 25-27, further comprising means for asserting a SMI in response to a determination that the detected error is absent from the memory after the correction.

Example 31 includes the apparatus of any one of Examples 25-27, wherein the memory comprises volatile memory.

Example 32 includes the apparatus of Example 31, wherein the memory comprises DRAM.

Example 33 includes the apparatus of Example 32, wherein the memory comprises a DRAM cache line.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The invention claimed is:

1. An apparatus comprising a memory controller configured to perform or cause a remedial action to correct a detected error in data read from a memory, determine an error category for the detected error in data read from the memory, and selectively perform or cause an additional remedial action based at least in part on the error category determined, wherein the determination and the performance or causation of the additional remedial action are undertaken in response to the correction of the detected error in the data read from the memory.

2. The apparatus of claim 1, wherein the memory controller is further configured to categorize the detected error as transient in response to a determination that the detected error is absent from the memory after the correction.

3. The apparatus of claim 2, wherein the memory controller is further configured to categorize the detected error as transient in response to a determination that the detected error is absent from the memory after a write of the error-correct data back to the memory.

4. The apparatus of claim 1, wherein the apparatus further comprises a basic input/output system ("BIOS"), and the memory controller is further configured to cause the BIOS to be informed of the detected error, in response to detection of an error in the memory by the memory controller after the correction.

5. The apparatus of claim 1, wherein the apparatus further comprises an operating system, and the memory controller is further configured to cause the operating system to be informed of the detected error, in response to detection of an error in the memory by the memory controller after the correction.

6. The apparatus of claim 1, wherein the memory controller is further configured to assert a System Management Interrupt ("SMI") in response to detection of an error in the memory by the memory controller after the correction.

7. The apparatus of claim 1, wherein the memory comprises volatile memory.

8. The apparatus of claim 7, wherein the memory comprises dynamic random access memory ("DRAM").

9. The apparatus of claim 8, wherein the memory comprises a DRAM cache line.

10. At least one non-transitory storage medium comprising instructions stored therein, wherein the instructions, in response to execution by a controller, cause the controller to:
    detect an error in data read from a memory;
    perform or cause a remedial action to correct the detected error in the data read from the memory;
    determine an error category for the detected error; and
    selectively perform or cause an additional remedial action based at least in part on the error category determined;
    wherein the determination and the performance or causation of the additional remedial action are undertaken in response to the correction.

11. The at least one non-transitory storage medium of claim 10, wherein the instructions, in response to execution by the controller, cause the controller to categorize the detected error as transient in response to a determination that the detected error is absent from the memory after the correction.

12. The at least one non-transitory storage medium of claim 11, wherein the instructions, in response to execution by the controller, cause the controller to categorize the detected error as transient in response to a determination that the detected error is absent from the memory after a write of the error-correct data back to the memory.

13. The at least one non-transitory storage medium of claim 10, wherein the instructions, in response to execution by the controller, cause a basic input/output system ("BIOS") of a system hosting the controller to be informed of the detected error, in response to detection of an error in the memory after the correction.

14. The at least one non-transitory storage medium of claim 10, wherein the instructions, in response to execution by the controller, cause an operating system of a system hosting the controller to be informed of the detected error, in response to detection of an error in the memory after the correction.

15. The at least one non-transitory storage medium of claim 10, wherein the instructions, in response to execution by the controller, cause the controller to assert a System Management Interrupt ("SMI") in response to detection of an error in the memory after the correction.

16. The at least one non-transitory storage medium of claim 10, wherein the memory comprises volatile memory.

17. The at least one non-transitory storage medium of claim 16, wherein the memory comprises dynamic random access memory ("DRAM").

18. A computer-implemented method, comprising:
    detecting, by a computing device, an error in data read from a memory;
    performing or causing a remedial action, by the computing device, to correct the detected error in the data read from the memory;
    determining, by the computing device, an error category for the detected error; and
    selectively performing or causing, by the computing device, an additional remedial action based at least in part on the error category determined;
    wherein the determining and the performing or causing the additional remedial action are undertaken in response to the correcting.

19. The computer-implemented method of claim 18, further comprising categorizing, by the computing device, the detected error as transient in response to a determination that the detected error is absent from the memory after the correction.

20. The computer-implemented method of claim 19, further comprising categorizing, by the computing device, the detected error as transient in response to a determination that the detected error is absent from the memory after a write of the error-corrected data back to the memory.

* * * * *